United States Patent
Lee et al.

(10) Patent No.: US 10,113,079 B2
(45) Date of Patent: Oct. 30, 2018

(54) CONDUCTIVE COMPOSITION

(71) Applicant: DONGJIN SEMICHEM Co., Ltd., Incheon (KR)

(72) Inventors: Seung Hyuk Lee, Seongnam (KR); Ju Kyung Han, Seongnam (KR); Young Mo Kim, Seongnam (KR); Hyun Seok Yoo, Seongnam (KR); Kyung Eun Kim, Seongnam (KR)

(73) Assignee: DONGJIN SEMICHEM CO., LTD., Incheon (KR)

( * ) Notice: Subject to any disclaimer, the term of this patent is extended or adjusted under 35 U.S.C. 154(b) by 0 days.

(21) Appl. No.: 15/312,729

(22) PCT Filed: May 21, 2015

(86) PCT No.: PCT/KR2015/005103
§ 371 (c)(1),
(2) Date: Nov. 21, 2016

(87) PCT Pub. No.: WO2015/178696
PCT Pub. Date: Nov. 26, 2015

(65) Prior Publication Data
US 2017/0190930 A1    Jul. 6, 2017

(30) Foreign Application Priority Data
May 22, 2014 (KR) .................. 10-2014-0061869

(51) Int. Cl.
C09D 11/52 (2014.01)
C09D 11/033 (2014.01)
H01L 31/0224 (2006.01)
H05K 1/02 (2006.01)

(52) U.S. Cl.
CPC ............ C09D 11/52 (2013.01); C09D 11/033 (2013.01); H05K 1/02 (2013.01); H01L 31/022425 (2013.01)

(58) Field of Classification Search
CPC .................. C09D 11/52; C09D 11/033; H01L 31/022425
USPC ........................ 106/31.92; 252/512, 513, 514
See application file for complete search history.

(56) References Cited

U.S. PATENT DOCUMENTS

| 4,833,033 A * | 5/1989 | Sannohe | C09C 1/62 252/512 |
| 5,068,150 A * | 11/1991 | Nakamura | C08K 9/04 252/512 |
| 6,335,077 B1 * | 1/2002 | Tani | H01L 21/486 252/513 |
| 7,022,266 B1 * | 4/2006 | Craig | C09D 11/52 252/514 |
| 7,368,070 B2 * | 5/2008 | Akimoto | H01C 1/148 252/512 |
| 2007/0193026 A1 * | 8/2007 | Dong | C23C 18/08 29/825 |
| 2009/0085015 A1 * | 4/2009 | Sato | C23C 18/08 252/519.21 |
| 2010/0123102 A1 * | 5/2010 | Heo | H01B 1/22 252/519.2 |
| 2012/0225198 A1 * | 9/2012 | Seong | C09D 11/52 252/512 |
| 2014/0186525 A1 * | 7/2014 | Seong | H05K 3/1275 427/123 |

FOREIGN PATENT DOCUMENTS

| CN | 101523509 | 9/2009 |
| KR | 10-2007-0087517 | 8/2007 |
| KR | 10-2009-0034276 | 4/2009 |
| KR | 10-2010-0031843 | 3/2010 |
| KR | 10-2011-0021681 | 3/2011 |
| KR | 10-2014-0056045 | 5/2014 |

OTHER PUBLICATIONS

English translation of KR-10-2010-0031843, Mar. 2010; 11 pages.*
English translation of KR-10-2014-0056045, May 2014; 23 pages.*

* cited by examiner

*Primary Examiner* — Helene Klemanski
(74) *Attorney, Agent, or Firm* — Lex IP Meister, PLLC

(57) ABSTRACT

The present invention relates to a conductive composition, and more particularly, to a conductive copper ink or paste composition for forming fine pattern which comprises a metal precursor and copper powder to increase the density of metal pattern formed during sintering and improve surface roughness, thereby being capable of achieving excellent electrical conductivity, adhesion strength to a substrate, and printability.

13 Claims, 4 Drawing Sheets

CONDUCTIVE COMPOSITION

FIELD OF THE INVENTION

The present invention relates to a conductive composition, and more particularly, to a conductive copper ink or paste composition for forming fine pattern which comprises a metal precursor and a copper powder to increase the density of metal pattern formed during sintering and improve surface roughness, thereby being capable of achieving excellent electrical conductivity, adhesion strength to a substrate, and printability.

BACKGROUND OF THE INVENTION

With the recent trends of the miniaturization of electronic devices and the various applications of substrates, there are increasing demands on the formation of fine wiring on thin films through a variety of printing methods, and researches on superior surface roughness and underpricing are actively going on. In particular, since there are likely a short circuit issue in the process due to surface roughness defects in multi-layer thin film structures, an adhesion strength issue due to reliability degradation, and an image quality issue in displays, researches for improving printing precision and surface roughness and lowering the prices are actively going on.

So far, silver (Ag) particles have been used for the conductive inks or pastes for printing. Compositions consisting of silver are easy to be prepared, have excellent stability and are thus stable even after printing so that they are widely applied, but since its price is changeable and high, there are increasing interests in copper (Cu)-containing inks or pastes to replace it.

Thus, Korea Patent Publication No. 2010-0118219 discloses a flexible substrate for display panel, and in particular, it describes that in order to use it as a substrate for liquid crystal display device, it is essential to develop a plastic optical film with low surface roughness and thermal expansion coefficient, and surface roughness is important because if the surface of a substrate is not flat and is very rough, it causes image quality defects in display machines.

In addition, if the surface roughness and dispersibility of metal pastes are not good, aggregates are formed, and due to this, a short circuit occurs and reliability is degraded, and since electrode thickness is not even, there is a difficulty in thinning interior electrodes. Therefore, in order to solve the above problems, Korea Patent Publication No. 2005-0104042 discloses a method for the preparation of a high dispersion metal paste for interior electrode having excellent surface roughness which is used for the preparation of high capacity multi-layer ceramic condenser (MLCC) according to recent changes in electronic device industry, but it merely prepared an evenly-dispersed paste using a 3-roll mill after dispersing metal powder in a high viscosity and separately dispersing ceramic powder in a low viscosity.

Thus, there is a demand on the development of a conductive composition (ink or paste) capable of improving surface roughness by selectively printing a copper thin film on only the desired portion of a substrate through the optimization of electrode density during sintering and the optimized dispersion of the conductive composition.

SUMMARY OF THE INVENTION

In order to solve the above problems, it is an object of the present invention to provide a conductive composition with high conductivity and capable of easy thick film formation and reliability achievement by mixing a metal precursor and a copper particle to incorporate the metal precursor between the copper particles, thereby increasing the density of an electrode formed during sintering and improving surface roughness, and a metal fine pattern formed with the conductive composition.

To achieve the above objects, the present invention provides a conductive composition comprising
a) 30 to 70% by weight of copper (Cu) powder;
b) 10 to 20% by weight of a metal precursor;
c) 1 to 20% by weight of a binder resin; and
d) a remainder of a solvent.

In another aspect, the invention provides a method for forming a metal fine pattern characterized by printing the conductive composition on a substrate and applying thermal treatment.

In another aspect, the invention provides a metal fine pattern prepared by the method for forming metal fine pattern.

The conductive composition of the present invention can increase the density of an electrode formed during sintering and improve surface roughness by mixing a copper particle and a metal precursor to incorporate the metal precursor between the copper particles, and it shows excellent performances such as high conductivity, easy thick film formation and substrate adhesion strength improvement.

Accordingly, the conductive composition in accordance with the present invention can be usefully used in forming fine pattern in an electrode for crystalline solar cells, an electrode of thin film solar cells, an electrode for dye-sensitive solar cells, an electrode for touch panels, RFID antenna or multi-layer capacitor circuits.

DETAILED DESCRIPTION OF THE INVENTION

Figure 1:
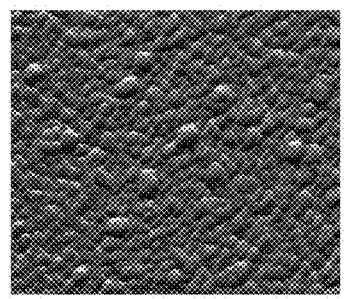
FIG. 1 to FIG. 7 are atomic force microscope (AFM) photographs for observing the surfaces of the copper ink compositions of Examples 1 to 2 and Comparative Examples 1 to 5.
Figure 2:
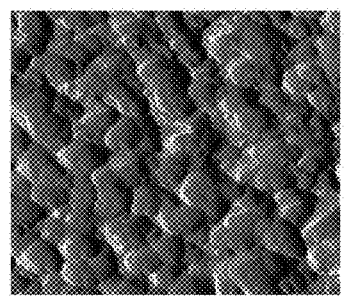
Figure 3:
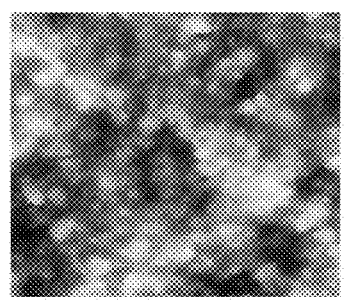
Figure 4:
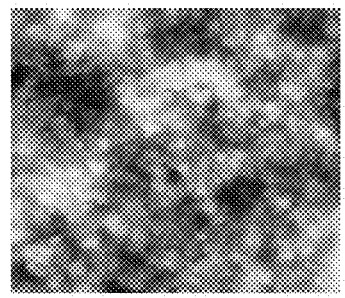
Figure 5:
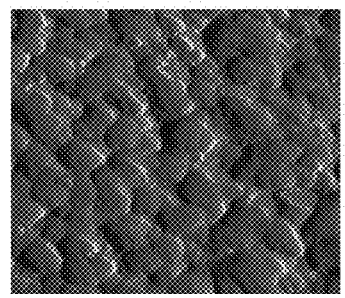
Figure 6:
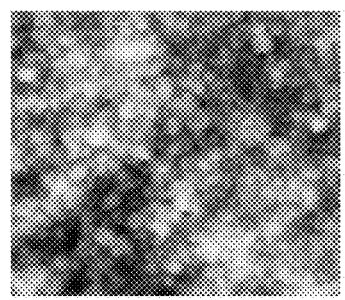
Figure 7:
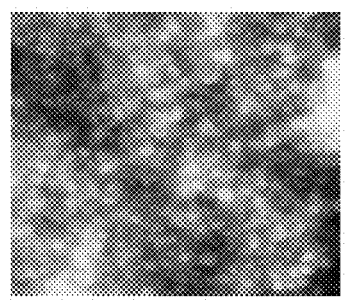

The conductive composition is characterized by comprising
a) 30 to 70% by weight of copper (Cu) powder;
b) 10 to 20% by weight of a metal precursor;
c) 1 to 20% by weight of a binder resin; and
d) a remainder of a solvent.

Hereafter, each component will be described in detail.

a) Copper Powder

For the conductive copper powder used in the present invention, any copper powders used in inks or pastes for forming electrodes may be used, and preferably, it may be a copper nanoparticle coated with an organic substance at the surface of the copper particle, and more preferably, it may be a copper nanoparticle where amine is absorbed or remains in the surface of the particle.

The copper particle may have an average particle size of 40 to 1,000 nm, preferably 100 to 500 nm, the particle size of the copper nanoparticle may be adjusted by controlling the type of amines, and it has an advantage in that the oxide film of copper is suppressed as alkalinity increases.

The copper nanoparticle may be prepared by producing a copper complex compound using an organic amine and then performing reduction. Preferably, the amine on the surface of the copper synthesized may be absorbed in an amount of about 0.5 to 10% by weight of the total copper nanoparticle and more preferably, it may be absorbed in an amount of 2 to 5% by weight. The absorbed amine has an effect on suppressing oxidation or increasing dispersion ability. The analysis of the absorbed amine is performed via TGA (thermogravimetric analysis).

Most of the copper particles produced in this method form a particle size of 1 μm or less and has a spherical form. In general, if amine with bulky alkali remains in a nanoparticle, dispersion ability increases with the increase of zeta potential. Thus, there is no need to add a dispersion stabilizer as an additive since it is easy to disperse in a variety of solvents. Further, as the particle size gets smaller, the amount of the remaining amine is relatively increased, and the zeta potential is thus increased more, causing excellent dispersion ability, which becomes advantageous in the printing process.

The conductive copper powder in the present invention may be included in an amount of 30 to 70% by weight. If it is included in less than 30% by weight, the contact density of the conductive copper powder gets smaller and a line resistance or sheet resistance after printing is not thus achieved as desired, and the viscosity of the paste becomes smaller and the printing performance is thus significantly reduced. If the amount exceeds 70% by weight, it is difficult to obtain an even dispersion of the conductive copper powder and the printing performance is reduced due to viscosity over the limit.

b) Metal Precursor

The present invention comprises a metal precursor for improving the density of an electrode and surface roughness.

The metal precursor is not particularly limited as long as it is a metal precursor used in the formation of electrodes, and for example, the metal of the metal precursor may be silver (Ag), copper, nickel or alloys containing them. The metal precursor may be included as a solution or a crystal in the conductive composition of the present invention, and preferably, it may be a metal precursor capable of exhibiting resistance by being decomposed when treated with heat at a thermal treatment temperature of not higher than 350° C., and in particular, a metal precursor synthesized using a fatty acid containing 6 to 18 carbon atoms is preferable.

As specific examples of the metal precursor, there can be used one or more selected from the group consisting of copper fatty acid precursors such as Cu-hexanoate, Cu-heptanoate, Cu-octanoate, Cu-nonanoate, Cu-decanoate, Cu-neodecanoate, Cu-stearate, Cu-isostearate, Cu-oleate, Cu-ricinoleate, etc.;

silver fatty acid precursors such as Ag-hexanoate, Ag-heptanoate, Ag-octanoate, Ag-nonanoate, Ag-decanoate, Ag-neodecanoate, Ag-stearate, Ag-isostearate, Ag-oleate, Ag-ricinoleate, etc.;

nickel fatty acid precursors such as Ni-hexanoate, Ni-heptanoate, Ni-octanoate, Ni-nonanoate, Ni-decanoate, Ni-neodecanoate, Ni-stearate, Ni-isostearate, Ni-oleate, Ni-ricinoleate, etc.; or precursors in a salt form such as copper cyanide (Cu(CN)$_2$), copper oxalate (Cu(COO)$_2$), copper acetate (CH$_3$COOCu), copper carbonate (CuCO$_3$), cupric chloride (CuCl$_2$), cuprous chloride (CuCl), copper sulfate (CuSO$_4$), copper nitrate (Cu(NO$_3$)$_2$), silver nitrate (AgNO$_3$), silver peroxide (Ag$_2$O), silver oxide (AgO), silver chloride (AgCl), silver sulfate (Ag$_2$SO$_4$), nickel nitrate (Ni(NO$_3$)$_2$), nickel chloride (NiCl$_2$), nickel sulfate (NiSO$_4$), etc.

The metal precursor in the present invention may be included in an amount of 10 to 20% by weight, and if it is added in less than 10% by weight, it is difficult to improve an electrode density, thereby decreasing roughness improvement effects, and if it is added in an excessive amount exceeding 20% by weight, electrical conductivity is rather decreased.

c) Binder Resin

The binder resin used in the present invention may be any binder resins ordinarily used in ink or paste composition for printing. As specific examples, there can be used cellulose type resins such as methylcellulose, ethylcellulose, hydroxypropylcellulose, hydroxyl propylmethylcellulose, celluloseacetatebutyrate, carboxylmethylcellulose and hydroxyethylcellulose, polyurethane type resins, epoxy type resins, polyester type resins, acryl type resins, and copolymers prepared by mixing one or more of them.

The binder resin in the present invention may be included in an amount of 1 to 20% by weight, and if it is not within the ranges, the printability deteriorates, causing an open circuit, or pattern after the printing is likely to widely spread, thereby increasing the possibility of a short circuit, and the conductivity and dispersion stability after sintering may be reduced.

d) Solvent

The solvent in the present invention is a solvent typically used in paste compositions for printing and is not particularly limited as long as it is a solvent capable of dissolving the binder resin and dispersing the copper nanoparticle and the metal precursor.

Preferably, for the solvent used in the present invention, a polar or non-polar solvent having a boiling point of 60 to 300° C. may be used, and for example, there can be used a mixture of one or more from alcohols such as methanol, ethanol, propanol, isopropanol, butanol, 2-butanol, octanol, 2-ethylhexanol, pentanol, benzyl alcohol, hexanol, 2-hexanol, cyclohexanol, terpineol, etc.; glycols such as methylene glycol, ethylene glycol, butylene glycol, diethylene glycol, triethylene glycol, tetraethylene glycol, etc.; and organic solvents such as toluene, xylene, dimethyl carbonate, diethyl carbonate, propyleneglycolmethylether acetate, 2-methoxy ethyl acetate, 2-(2-ethoxyethoxy)ethylacetate, propyleneglycolmono methylether, N-methyl-2-pyrrolidone, etc.

The solvent is included in the remaining amount of the conductive composition in the present invention, and it may be included preferably in an amount of 15 to 50% by weight. When it is within the above ranges, it can improve the printability and the profile of pattern at the same time.

The conductive composition of the present invention may further comprise an optional additive other than the above components. For the additive, additives included in ink or paste compositions for forming electrodes may be used in a typical range of amount, and for example, a rheology modifier, a dispersing agent, or a surfactant may be included in a range of 1 to 10% by weight, respectively.

Preferably, in order to control viscoelasticity, a polyurethane acrylate type, acrylate type, and polyester type fluidity additive (rheology modifier) may be included in 3 to 10% by weight.

Further, the conductive composition may be prepared by mixing each of the components constituting the composition, and preferably, it may be prepared by the following steps:

(1) preparing a binder solution by dissolving a binder resin in at least one type of solvent;

(2) adding a copper powder to the binder solution and mixing them;

(3) optionally adding an additive and a solvent to the solution obtained in the above step (2) and mixing them; and (4) mixing the mixture of the above step (2) or step (3) with a metal precursor or a metal precursor solution.

In another aspect, the present invention provides a method for forming a metal fine pattern characterized by printing the conductive composition on a substrate and applying thermal treatment and a metal fine pattern prepared by this method.

Printing in the present invention may use a variety of printing processes conventionally used in the art, for example, Gravure off-set printing, Gravure direct printing, screen printing, imprinting, and all the typical substrates can be used for the substrate to be applied and for example, a glass substrate or a plastic substrate can be both applied. Further, the thermal treatment may be performed by drying and sintering in accordance with the methods conventionally used in the art to form a metal fine pattern, and preferably, the thermal treatment temperature may be 100 to 350° C.

The conductive composition according to the present invention increases the density of an electrode formed during sintering and improves surface roughness by mixing a copper particle of which the oxidation is suppressed and a metal precursor to incorporate the metal precursor between the copper particles, thereby showing excellent performances such as high conductivity, easy thick film formation and substrate adhesion strength improvement, so that it can be usefully used in forming fine pattern in an electrode for crystalline solar cells, an electrode of thin film solar cells, an electrode for dye-sensitive solar cells, an electrode for touch panels, RFID antenna or multi-layer capacitor circuits.

For a better understanding of the present invention, preferred examples follow. The following examples are intended merely to illustrate the invention without limiting the scope of the invention.

Examples 1 to 2 and Comparative Examples 1 to 6

The copper ink compositions were prepared using the compositions of Table 1 below by the following methods.

After a binder solution was prepared by dissolving a polymer resin (binder) in one or more organic solvents, a copper nanoparticle coated with an organic substance was added and mixed and then, an additive and an organic solvent were added and mixed. A copper precursor was mixed with the product obtained in the above to prepare a copper ink composition. The mixing was performed at a room temperature within 5 min. at 1,200 to 1,300 rpm, using a paste mixer of PDM-300V (Vacuum Type) purchased from Daehwa Tech Co., Ltd.

TABLE 1

|  | Copper powder | Polymer resin | Additive | Organic solvent | | Metal precursor |
|---|---|---|---|---|---|---|
|  | Copper nanoparticle | Cellulose resin | Urethane acrylate | Terpineol | Isopropyl alcohol | Copper neodecanoate |
| Com. Ex. 1 | 30 g | 0.8 g | 3 g | 8 g | 24 g | — |
| Com. Ex. 2 | 30 g | 0.8 g | 6 g | 8 g | 24 g | — |
| Ex. 1 | 30 g | 0.8 g | 6 g | 8 g | 24 g | 10 g |
| Ex. 2 | 30 g | 0.8 g | 6 g | 8 g | 24 g | 15 g |
| Com. Ex. 3 | 30 g | 0.8 g | 9 g | 8 g | 24 g | — |
| Com. Ex. 4 | 30 g | 0.8 g | 6 g | 8 g | 24 g | 5 g |
| Com. Ex. 5 | 30 g | 0.8 g | 6 g | 8 g | 24 g | 20 g |
| Com. Ex. 6 | — | — | — | 3.7 g | 11.5 g | 30 g |

Test Example 1

The surfaces of the copper ink compositions prepared in the above Examples 1 to 2 and Comparative Examples 1 to 5 were observed using an atomic force microscope (AFM), and the results are shown in FIGS. 1 to 7.

Further, the surface roughness and sheet resistance of the copper ink compositions prepared in the above Examples 1 to 2 and Comparative Examples 1 to 6 were measured, and the results are shown in Table 2 below.

The sheet resistance was measured as electrical conductivity using a 4-point probe sheet resistor (System 302) manufactured by MS TECH.

TABLE 2

|  | Surface roughness (Ra, nm) | Sheet resistance (Ω/□) |
|---|---|---|
| Com. Ex. 1 | 142 | 0.048 |
| Com. Ex. 2 | 125 | 0.059 |
| Ex. 1 | 73 | 0.081 |
| Ex. 2 | 65 | 0.095 |
| Com. Ex. 3 | 119 | 0.197 |
| Com. Ex. 4 | 114 | 0.068 |
| Com. Ex. 5 | 47 | 5.7 |
| Com. Ex. 6 | — | 6.99 |

As shown in the above Table 2, the copper ink compositions in accordance with the present invention had excellent surface roughness and sheet resistance and in particular, their surface roughness, which were about 73 nm and 65 nm, respectively, were significantly improved by containing the copper precursors in comparison with Comparative Examples 1 to 3 with no copper precursors.

Test Example 2

Figure 8:
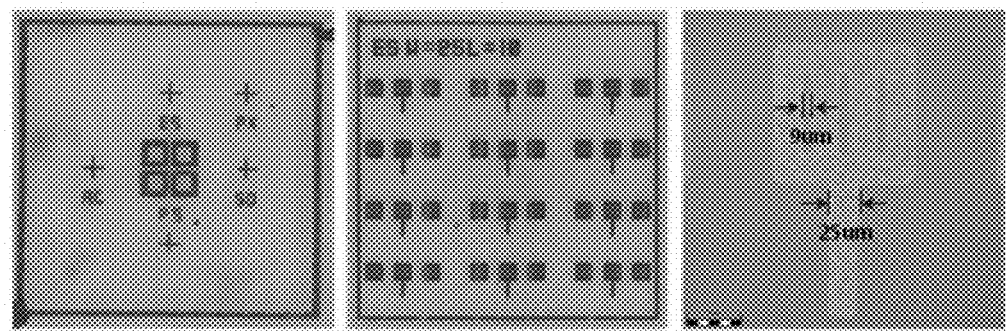
FIG. 8 is a photograph showing print patterns using the copper ink composition of Example 1.
Figure 9:
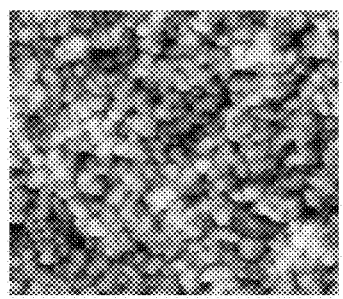
FIG. 9 to FIG. 12 are atomic force microscope photographs for observing the surfaces of the copper paste compositions of Example 3 and Comparative Examples 7 to 9.
Figure 10:
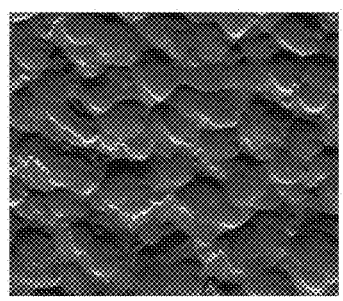
Figure 11:
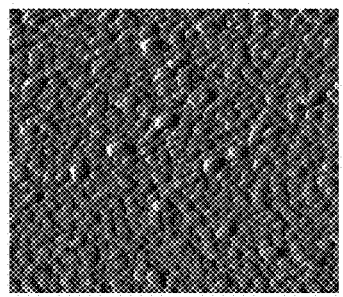
Figure 12:
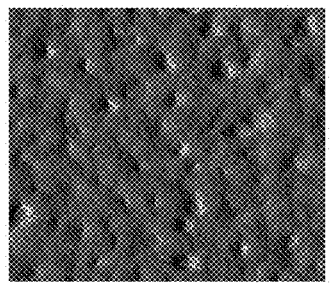

The copper ink composition of Example 1 was coated on a substrate using an applicator and then, printing was carried out using TI-7400 Blanket of Taein Chemical Co., Ltd. and off-set machine of Narae Nanotech (thickness: about 400-600 nm, line width: about 25 um pattern formation), and the results are shown in FIG. 8.

As shown in FIG. 8, the copper ink composition according to the present invention shows a superior printability.

Examples 3 and Comparative Examples 7 to 9

Copper paste compositions were prepared using the compositions of Table 3 below by methods equivalent to the above Examples 1 to 2 and Comparative Examples 1 to 6.

TABLE 3

|  | Copper powder Copper nanoparticle | Polymer resin Polyester resin | Additive Urethane acrylate | Organic solvent 2-(2-ethoxyethoxy) ethylacetate | Metal precursor Copper neodecanoate |
| --- | --- | --- | --- | --- | --- |
| Com. Ex. 7 | 30 g | 8 g | 2 g | 13 g | — |
| Ex. 3 | 30 g | 8 g | 2 g | 13 g | 10 g |
| Com. Ex. 8 | 30 g | 8 g | 2 g | 13 g | 5 g |
| Com. Ex. 9 | 30 g | 8 g | 2 g | 13 g | 15 g |

Test Example 3

The surfaces of the copper paste compositions prepared in the above Example 3 and Comparative Examples 7 to 9 were observed using an atomic force microscope (AFM), and the results are shown in FIGS. 9 to 12.

Further, the surface roughness and line resistance of the copper paste compositions were measured, and the results were shown in Table 4 below.

The surface roughness was measured in the same methods as the above Test Example 1, and the line resistance was measured as electrical conductivity.

TABLE 4

|  | Surface roughness (Ra, nm) | Line resistance (1 cm * 10 cm, Ω) |
| --- | --- | --- |
| Com. Ex. 7 | 247 | 16 |
| Ex. 3 | 111 | 29 |
| Com. Ex. 8 | 219 | 21 |
| Com. Ex. 9 | 78 | 70 |

As shown in the above Table 4, the copper paste composition in accordance with the present invention could obtain excellent effects in both line resistance and surface roughness in comparison with the paste compositions of Comparative Examples.

Test Example 4

Figure 13:
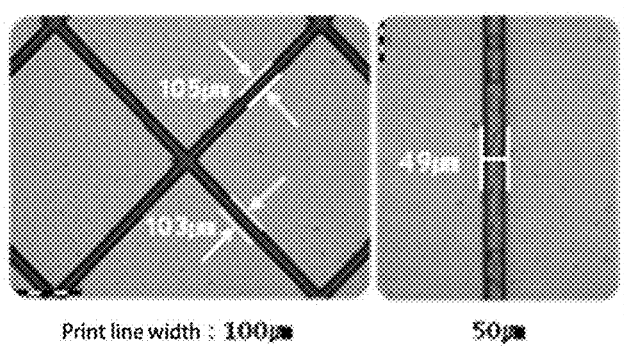
FIG. 13 and FIG. 14 are photographs showing print patterns and peel strengths using the copper paste compositions of Example 3 and Comparative Examples 7 to 9.
Figure 13:
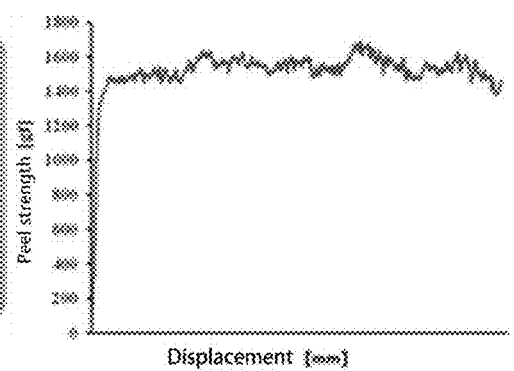
Figure 14:
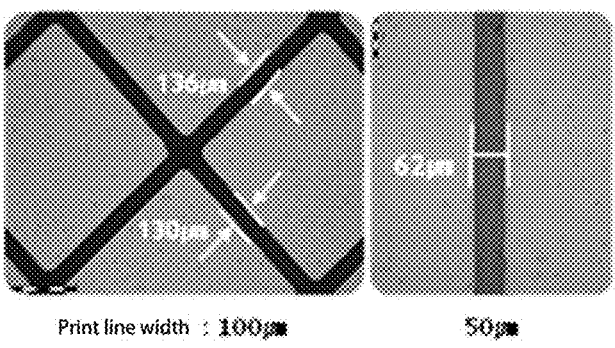
Figure 14:
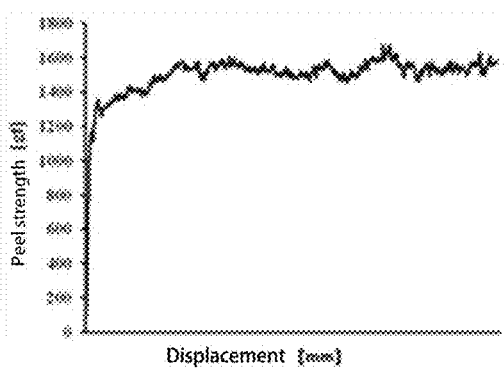

The copper paste compositions of the above Example 3 and Comparative Example 7 were coated on substrates using a screen equipment (SW-25GX) manufactured by Seowoo K & J Co., Ltd. and then, their peel strengths were measured in order to evaluate the adhesive strength, and the results are shown in FIGS. 13 and 14, respectively.

As shown in FIGS. 13 and 14, it was possible to achieve a line width of 50 um or so with the composition according to the present invention and the peel strength was superior over 1,400 gf.

What claimed is:

1. A conductive composition comprising
   a) 30 to 70% by weight of copper (Cu) powder;
   b) 10 to 20% by weight of a metal precursor;
   c) 1 to 20% by weight of a binder resin; and
   d) a remainder of a solvent,
   wherein the copper powder is a copper powder coated with an organic substance at its surface.

2. The conductive composition of claim 1, wherein the copper powder has an average particle size of 40 to 1,000 nm.

3. The conductive composition of claim 1, wherein the copper powder is coated with amine.

4. The conductive composition of claim 1, wherein the metal of the metal precursor is silver, copper, nickel or alloys containing them.

5. The conductive composition of claim 1, wherein the metal precursor is a metal precursor synthesized using a fatty acid containing 6 to 18 carbon atoms.

6. The conductive composition of claim 1, wherein the metal precursor is one or more selected from the group consisting of
   Cu-hexanoate, Cu-heptanoate, Cu-octanoate, Cu-nonanoate, Cu-decanoate, Cu-neodecanoate, Cu-stearate, Cu-isostearate, Cu-oleate, and Cu-ricinoleate;
   Ag-hexanoate, Ag-heptanoate, Ag-octanoate, Ag-nonanoate, Ag-decanoate, Ag-neodecanoate, Ag-stearate, Ag-isostearate, Ag-oleate, and Ag-ricinoleate; and
   Ni-hexanoate, Ni-heptanoate, Ni-octanoate, Ni-nonanoate, Ni-decanoate, Ni-neodecanoate, Ni-stearate, Ni-isostearate, Ni-oleate, and Ni-ricinoleate.

7. The conductive composition of claim 1, wherein the binder resin is one or more selected from the group consisting of a cellulose resin, an epoxy resin, a polyester resin, a polyurethane resin, and an acryl resin.

8. The conductive composition of claim 1, wherein the solvent is a polar or non-polar solvent having a boiling point of 60 to 300° C.

9. The conductive composition of claim 1, further comprising a rheology modifier, a dispersing agent, or a surfactant.

10. The conductive composition of claim 9, wherein the rheology modifier is polyurethane acrylate, acrylate, or polyester.

11. A method for forming a metal fine pattern, comprising printing the conductive composition of claim 1 on a substrate and applying thermal treatment.

12. A metal fine pattern produced by the method of claim 11.

13. The metal fine pattern of claim 12, wherein the metal fine pattern is an electrode for crystalline solar cells, an electrode of thin film solar cells, an electrode for dye-sensitive solar cells, an electrode for touch panels, RFID antenna or multi-layer capacitor circuits.

* * * * *